US008875779B2

(12) United States Patent
Lien

(10) Patent No.: US 8,875,779 B2
(45) Date of Patent: Nov. 4, 2014

(54) HEAT DISSIPATION ELEMENT WITH MOUNTING STRUCTURE

(75) Inventor: Cheng-Nan Lien, New Taipei (TW)

(73) Assignee: Asia Vital Compenents Co., Ltd., New Taipei (TW)

( * ) Notice: Subject to any disclaimer, the term of this patent is extended or adjusted under 35 U.S.C. 154(b) by 400 days.

(21) Appl. No.: 13/226,468

(22) Filed: Sep. 6, 2011

(65) Prior Publication Data

US 2013/0043005 A1 Feb. 21, 2013

(30) Foreign Application Priority Data

Aug. 17, 2011 (TW) .............................. 100129393

(51) Int. Cl.
*F28D 15/00* (2006.01)
*H01L 23/427* (2006.01)
*F28D 15/04* (2006.01)
*H01L 23/40* (2006.01)
*F28F 9/00* (2006.01)

(52) U.S. Cl.
CPC ............. *F28D 15/04* (2013.01); *F28F 2225/00* (2013.01); *H01L 23/427* (2013.01); *F28F 2275/20* (2013.01); *H01L 23/4006* (2013.01)
USPC ........................ 165/104.26; 165/67; 165/80.2

(58) Field of Classification Search
CPC .... F28F 280/00; F28F 2275/20; F28D 15/04; F28D 15/0275; F28D 15/0233; H01L 23/4006

USPC .......... 165/104.26, 104.21, 80.2, 67, 76, 170; 361/700, 718–719; 257/715, 719
See application file for complete search history.

(56) References Cited

U.S. PATENT DOCUMENTS

| 4,461,343 | A  | * | 7/1984  | Token et al. ............. 165/104.26 |
|-----------|----|---|---------|--------------------------------------|
| 6,535,386 | B2 | * | 3/2003  | Sathe et al. .................... 361/700 |
| 6,650,544 | B1 | * | 11/2003 | Lai ................................. 361/700 |
| 6,802,363 | B1 | * | 10/2004 | Wang ........................ 165/104.26 |
| 6,874,568 | B2 | * | 4/2005  | Lai ............................. 165/104.26 |
| 6,896,039 | B2 | * | 5/2005  | Dussinger et al. ........ 165/104.26 |
| 7,540,318 | B2 | * | 6/2009  | Nitta et al. ............... 165/104.26 |
| 2003/0155105 | A1 | * | 8/2003 | Garner ...................... 165/104.26 |
| 2003/0159806 | A1 | * | 8/2003 | Sehmbey et al. ............ 165/80.3 |

* cited by examiner

*Primary Examiner* — Tho V Duong

(57) ABSTRACT

A heat dissipation element with mounting structure includes a main body and a plurality of mounting elements. The main body includes a first side and a second side, between which a chamber is defined; a plurality of supports located in the chamber and respectively connected at two opposite ends to the first side and the second side of the main body; a working fluid filled in the chamber; and at least one wick structure layer internally attached to the chamber. The mounting elements respectively define an axial bore and have an end extended through the first side of the main body into the supports to thereby connect to the main body. With these arrangements, the heat dissipation element with the mounting elements connected thereto can tightly contact with a heat-generating element and maintain the chamber in the main body in an airtight state without leakage.

9 Claims, 9 Drawing Sheets

B-B Profile

B-B Profile

HEAT DISSIPATION ELEMENT WITH MOUNTING STRUCTURE

This application claims the priority benefit of Taiwan patent application number 100129393 filed on Aug. 17, 2011.

FIELD OF THE INVENTION

The present invention relates to a heat dissipation element with mounting structure, and more particularly to a heat dissipation element that has mounting elements connected thereto without causing damage to a main body thereof or leakage of a chamber in the main body to thereby avoid adverse influences on the heat transfer efficiency of the heat dissipation element.

BACKGROUND OF THE INVENTION

In response to the consumers' demands for compact electronic devices, all the electronic elements for the electronic devices must also be reduced in size. However, heat generated by the size-reduced electronic elements forms a main hindrance to the good performance of the compact electronic devices. Nevertheless, consumers still demand for enhanced performance of the electronic devices even if the semiconductors forming the electronic elements are constantly reduced in size.

A size-reduced semiconductor element would have increased heat flux. With the increased heat flux, it becomes more difficult to overcome the problem of cooling an electronic device. The increase of heat flux would cause overheat of the electronic device at different time and over different length or size of the device, and might cause damage to or even burnout of the whole electronic device.

A vapor chamber is applied to transfer heat between two relatively large faces, and is therefore different from a heat pipe that transfers heat between two points. And, the vapor chamber can be advantageously used in a relatively narrow space.

The vapor chamber has a heat absorption face and an opposite condensing face, and internally defines a vacuum space having a working fluid filled therein. The vacuum space is internally provided with a plurality of supports and a wick structure. The supports are respectively connected at two ends to the heat absorption face and condensing face for supporting the vacuum space. The heat absorption face of the vapor chamber is in contact with a heat source while the condensing face is connected to another heat dissipation element, so that heat absorbed by the working fluid is further transferred to the another dissipation device and dissipates into external environment therefrom. The working fluid absorbs heat from the heat absorption face and is therefore vaporized. The vapor-phase working fluid flows in the vacuum space to the condensing face and condenses into liquid again when contacting with the condensing face. The liquid-phase working fluid flows back toward the heat absorption face due to a capillary effect of the wick structure in the vacuum space to thereby complete one cycle of liquid-vapor circulation in the vapor chamber to transfer heat.

The conventional vapor chamber is used with a circuit board, so that heat generated by heat-generating elements on the circuit board is transferred to the vapor chamber and is finally dissipated into ambient air from the condensing face of the vapor chamber. To connect the vapor chamber to the circuit board, an internally threaded hollow copper post is extended through each of four corners of the vapor chamber without interfering with the vacuum space, and holes are formed on the circuit board at a positions corresponding to the copper posts, so that fastening elements can be screwed through the copper posts and the holes to lock the vapor chamber to the circuit board. To avoid interfering with the vacuum space, the copper posts are provided at four corners of the vapor chamber to locate relatively distant from the heat-generating elements. As a result, the heat absorption face of the vapor chamber is not in tight contact with the heat source and there is a thermal resistance between the vapor chamber and the heat-generating elements. To overcome the above problems, there are manufacturers who try to provide the copper posts on the vapor chamber at positions near the heat-generating elements. That is, the copper posts are directly extended through the vacuum space of the vapor chamber. In this manner, the vapor chamber can be in tight contact with the heat source to prevent the thermal resistance. However, the vacuum space being extended through by the copper posts loses its vacuum tightness and is no longer in a vacuum state. Further, the copper posts extended through the vacuum space would inevitably form an impediment in the flow path of the working fluid filled in the vacuum space to thereby have adverse influence on the smooth flowing of the working fluid and cause reduction in the heat transfer efficiency of the vapor chamber. In some worse conditions, the working fluid might leak out of the vacuum space to result in a useless vapor chamber. In brief, the vapor chamber with the conventional mounting structure is subjected to the following problems: (1) there would be a thermal resistance between the vapor chamber and the heat source; and (2) the vapor chamber might have reduced heat transfer efficiency.

SUMMARY OF THE INVENTION

A primary object of the present invention is to provide a heat dissipation element with mounting structure, so that a main body of the heat dissipation element is in tight contact with a heat-generating element via the mounting structure to avoid a thermal resistance.

Another object of the present invention is to provide a heat dissipation element with mounting structure, in which the mounting structure does not cause any damage to a main body of the heat dissipation element to ensure vacuum tightness of a chamber in the main body.

To achieve the above and other objects, the heat dissipation element with mounting structure according to the present invention includes a main body and a plurality of mounting elements.

The main body includes a first side and a second side, between which a chamber is defined; a plurality of supports located in the chamber and respectively connected at two opposite ends to the first side and the second side of the main body; a working fluid filled in the chamber; and at least one wick structure layer internally attached to the chamber.

The mounting elements respectively define an axial bore and have an end extended through the first side of the main body into the supports to thereby connect to the main body.

The heat dissipation element with mounting structure according to the present invention not only enables tight attachment of the heat dissipation element to heat-generating elements to avoid undesirable thermal resistance, but also ensures vacuum tightness of the chamber in the main body to avoid undesirable leakage of working fluid from the chamber because the mounting elements are extended into the supports without causing damage to the air-tightness of the chamber in the main body.

Therefore, the present invention provides the following advantages: (1) it can be tightly attached to the heat-generating elements to avoid thermal resistance; (2) it does not cause leakage of working fluid from the chamber of the main body; and (3) it has prolonged service life.

BRIEF DESCRIPTION OF THE DRAWINGS

The structure and the technical means adopted by the present invention to achieve the above and other objects can be best understood by referring to the following detailed description of the preferred embodiments and the accompanying drawings, wherein.

DETAILED DESCRIPTION OF THE PREFERRED EMBODIMENTS

Figure 1:
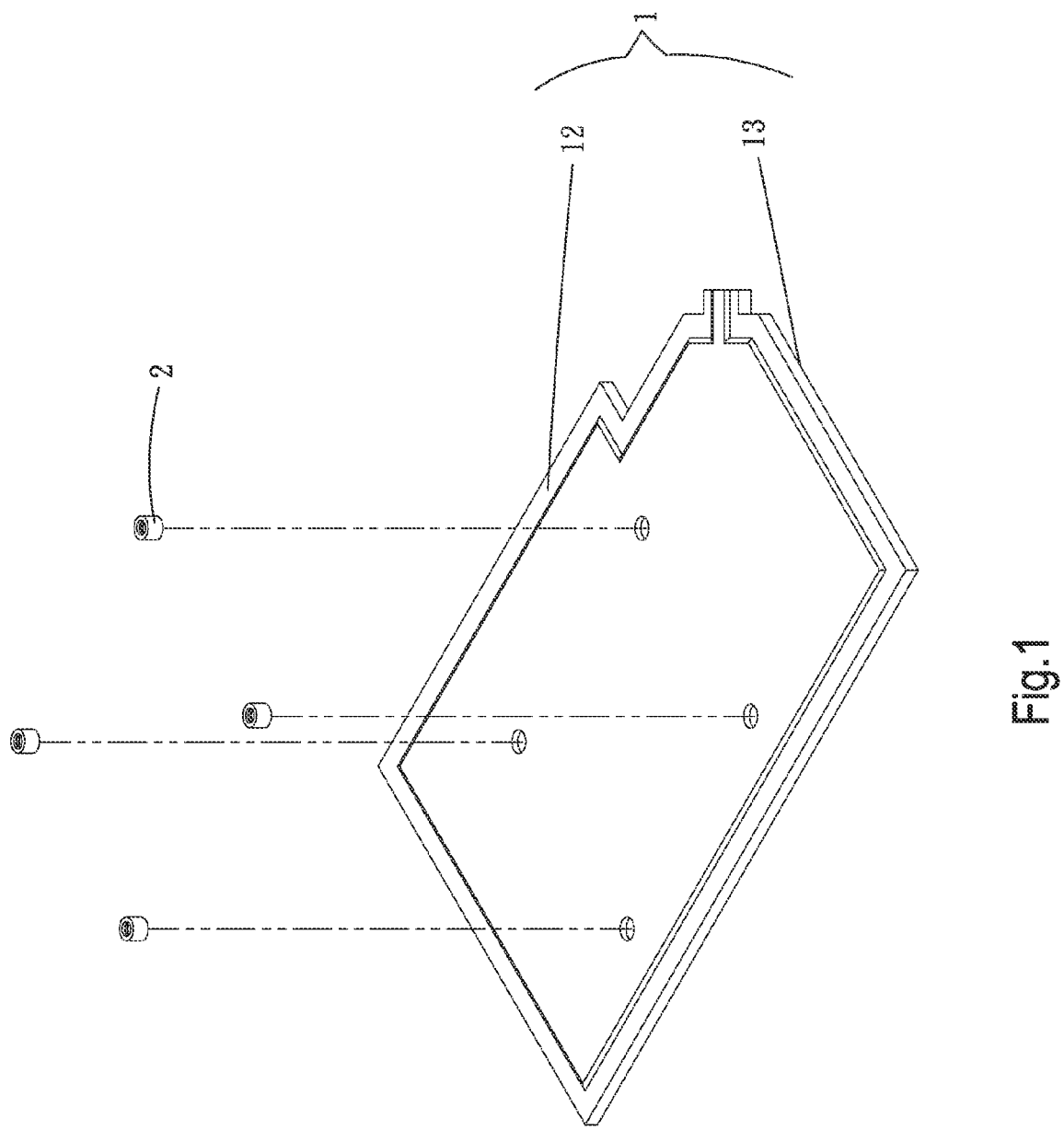
FIG. 1 is an exploded perspective view of a heat dissipation element with mounting structure according to a first embodiment of the present invention.

The present invention will now be described with some preferred embodiments thereof and with reference to the accompanying drawings. For the purpose of easy to understand, elements that are the same in the preferred embodiments are denoted by the same reference numerals.

Figure 2:
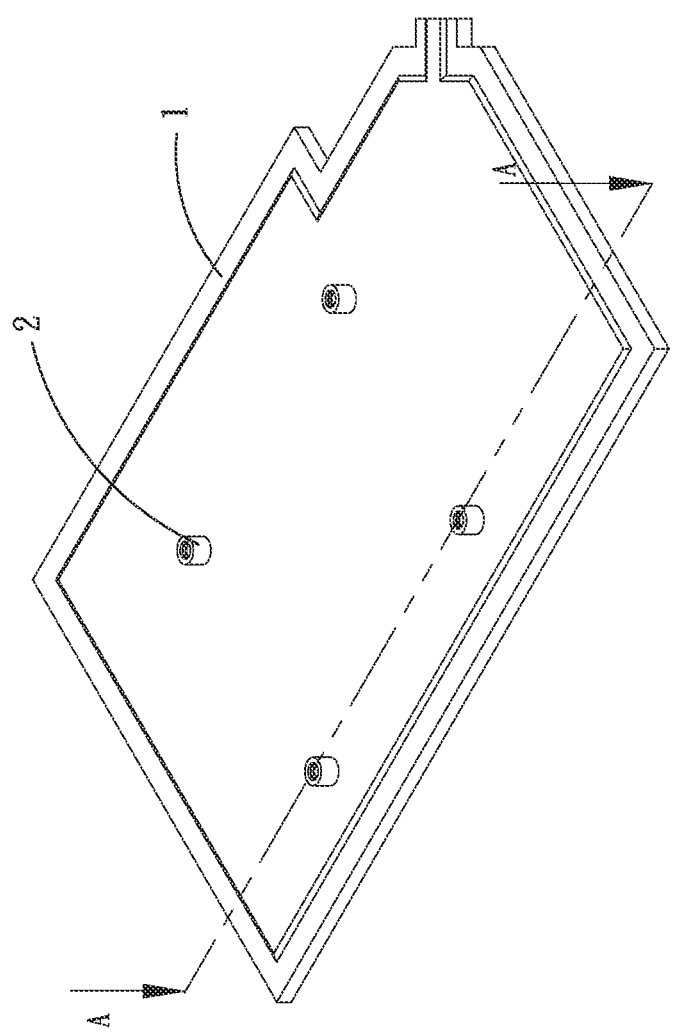
FIG. 2 is an assembled view of FIG. 1.
Figure 3:
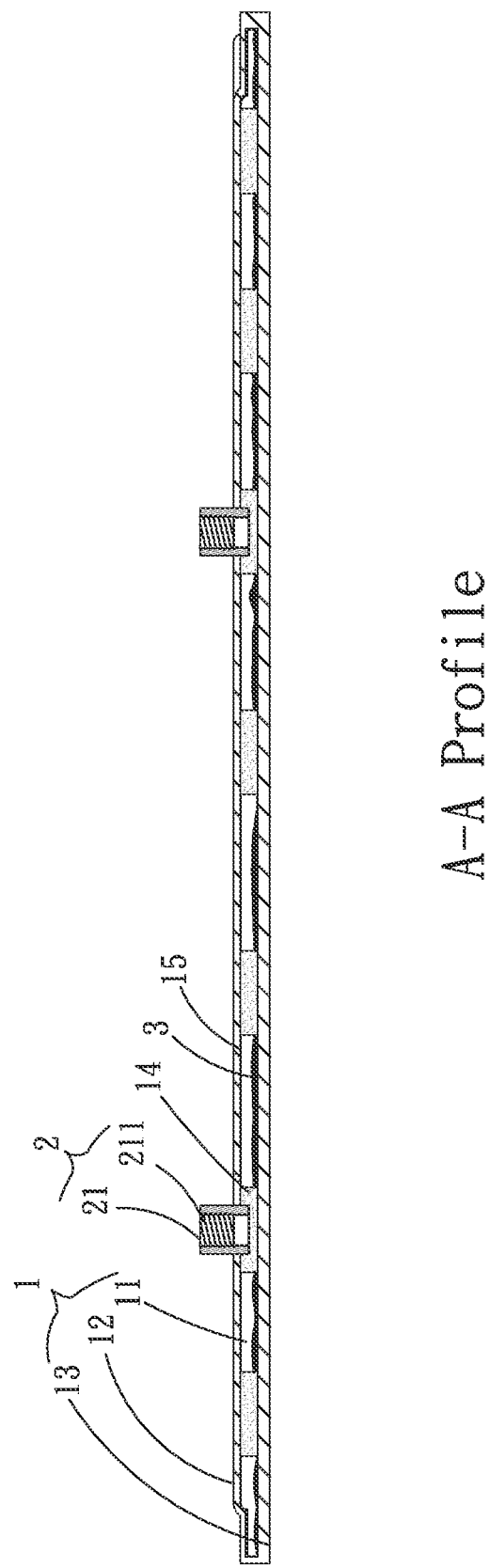
FIG. 3 is a sectional view taken along line A-A of FIG. 2.

Please refer to FIGS. 1 and 2 that are exploded and assembled perspective views, respectively, of a heat dissipation element with mounting structure according to a first embodiment of the present invention; and to FIG. 3 that is a sectional view taken along line A-A of FIG. 2. As shown, the present invention in the first embodiment includes a main body 1 and a plurality of mounting elements 2.

The main body 1 includes a first side 12 and a second side 13, between which a chamber 11 is defined; a plurality of supports 14 located in the chamber 11 and respectively connected at two opposite ends to the first side 11 and the second side 12 of the main body 1; a working fluid 3 filled in the chamber 11, and at least one wick structure layer 15 internally attached to the chamber 11 with structural integrity.

The mounting elements 2 respectively define an axial bore 21 and have an end extended through the first side 12 of the main body 1 into the supports 14 to thereby connect to the main body 1. The bores 21 of the mounting elements 2 are respectively provided with internal screw threads 211.

The mounting elements 2 are connected to the main body 1 by way of welding, corona discharging, machining, or ultrasonic welding, and are extended through the first side 12 of the main body 1 into the supports 14 by way of a mechanical process. The mechanical process can include, but not limited to, stamping, boring and drilling.

Since the mounting elements 2 are connected to the main body 1 by extending respective one end through the first side 12 of the main body 1 at positions corresponding to the supports 14, the mounting elements 2 would not have any adverse influence on the air-tightness of the chamber 11 defined in the main body 1, so that the chamber 11 is still in a vacuum state and the working fluid 2 filled therein would not leak out of the chamber 11.

Figure 4:
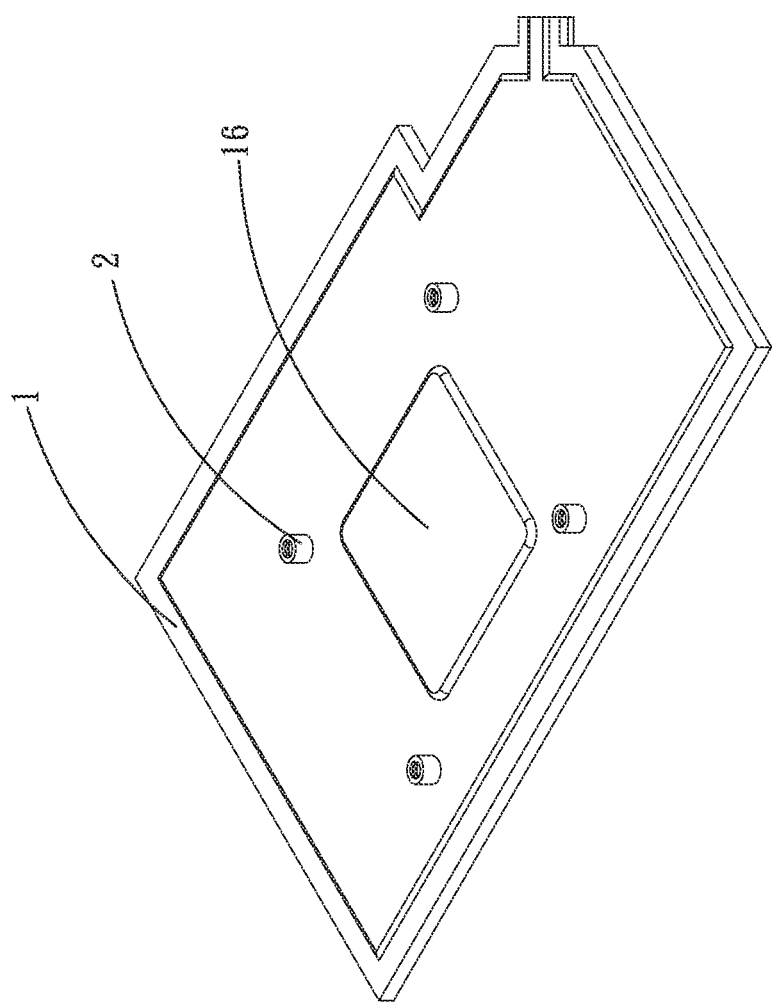
FIG. 4 is an assembled perspective view of a heat dissipation element with mounting structure according to a second embodiment of the present invention.

Please refer to FIG. 4 that is an assembled perspective view of a heat dissipation element with mounting structure according to a second embodiment of the present invention. As shown, the second embodiment is generally structurally similar to the first embodiment, except that the main body 1 in the second embodiment further includes at least one heat absorption zone 16. The heat absorption zone 16 is raised from an outer surface of the main body 1 and is located in the vicinity of the mounting elements 2.

Figure 5:
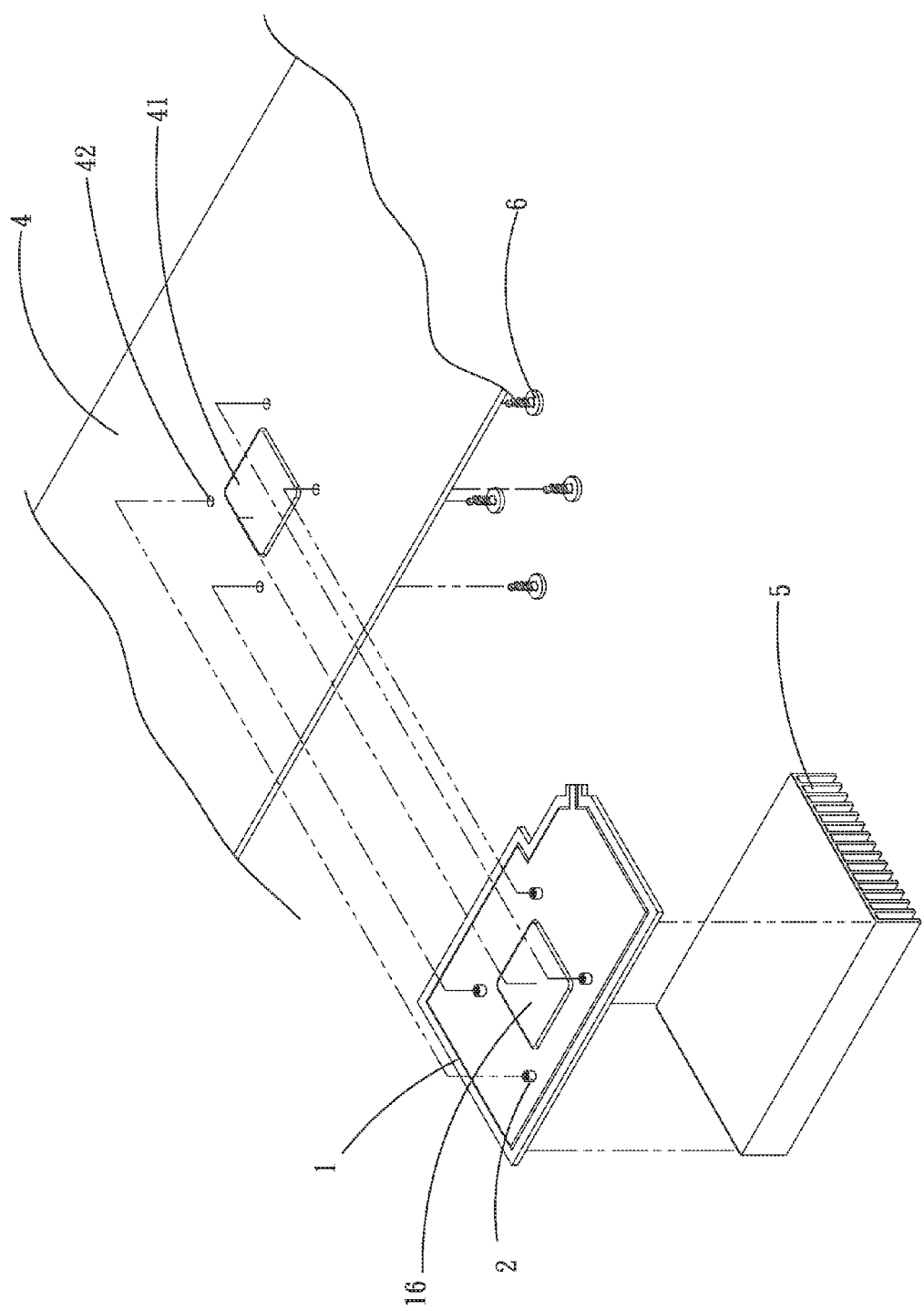
FIG. 5 is an exploded perspective view of a heat dissipation element with mounting structure according to a third embodiment of the present invention.
Figure 6:
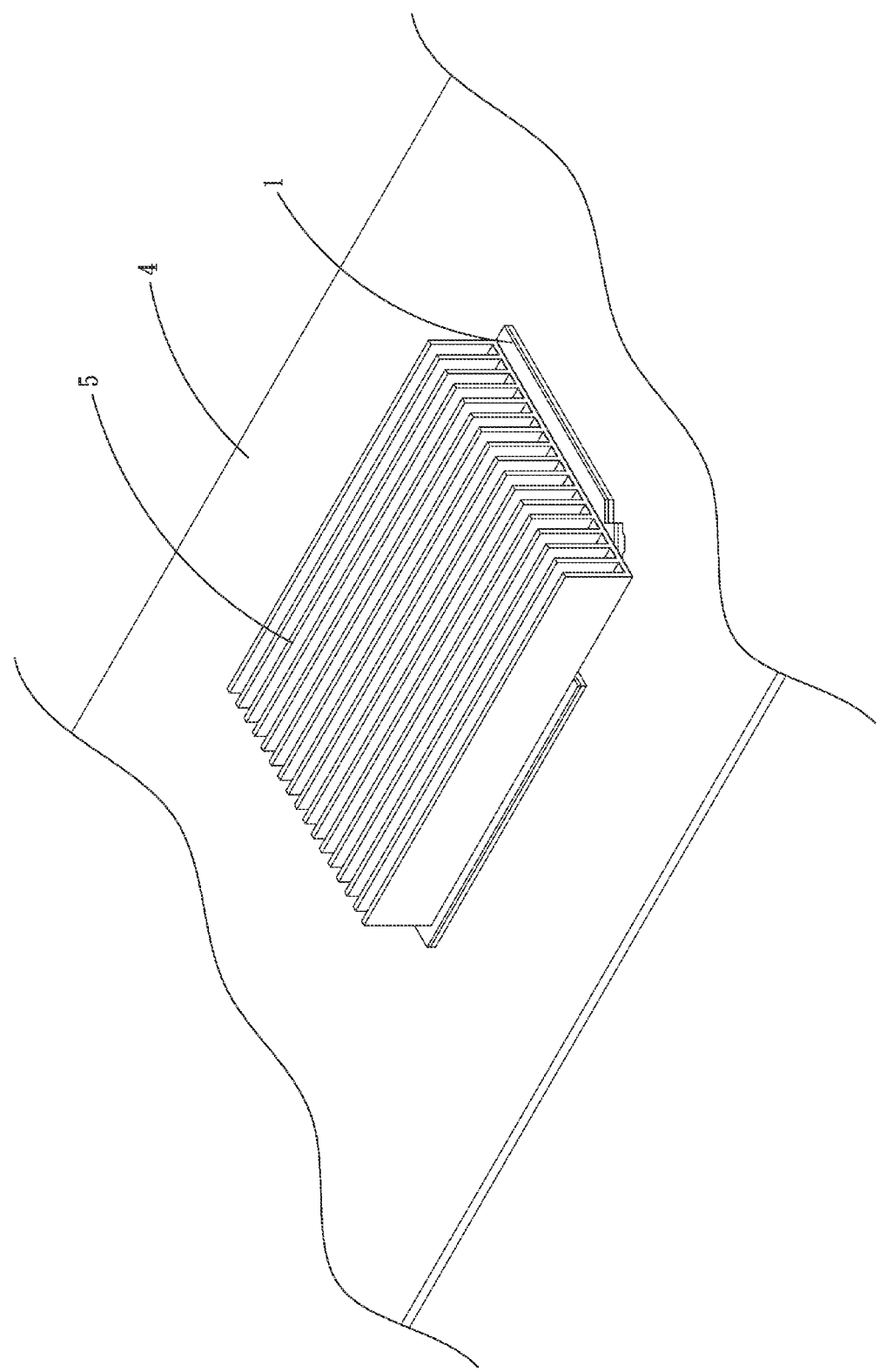
FIG. 6 is an assembled view of FIG. 5.

FIGS. 5 and 6 are exploded and assembled perspective views, respectively, of a heat dissipation element with mounting structure according to a third embodiment of the present invention. As shown, the third embodiment is generally structurally similar to the first embodiment, except that the main body 1 in the third embodiment is designed for correspondingly attaching to a circuit board 4. More specifically, the main body 1 in the third embodiment is provided on an outer surface with at least one raised heat absorption zone 16 for contacting with at least one heat source 41 on the circuit board 4. The circuit board 4 is provided at locations around the heat source 41 with a plurality of holes 42 corresponding to the mounting elements 2. A heat sink 5 is further connected to another outer surface of the main body 1 opposite to the heat absorption zone 16. Fastening elements 6 are extended through the holes 42 on the circuit board 4 into the mounting elements 2 to lock the main body 1 and the circuit board 4 to each other.

Figure 7:
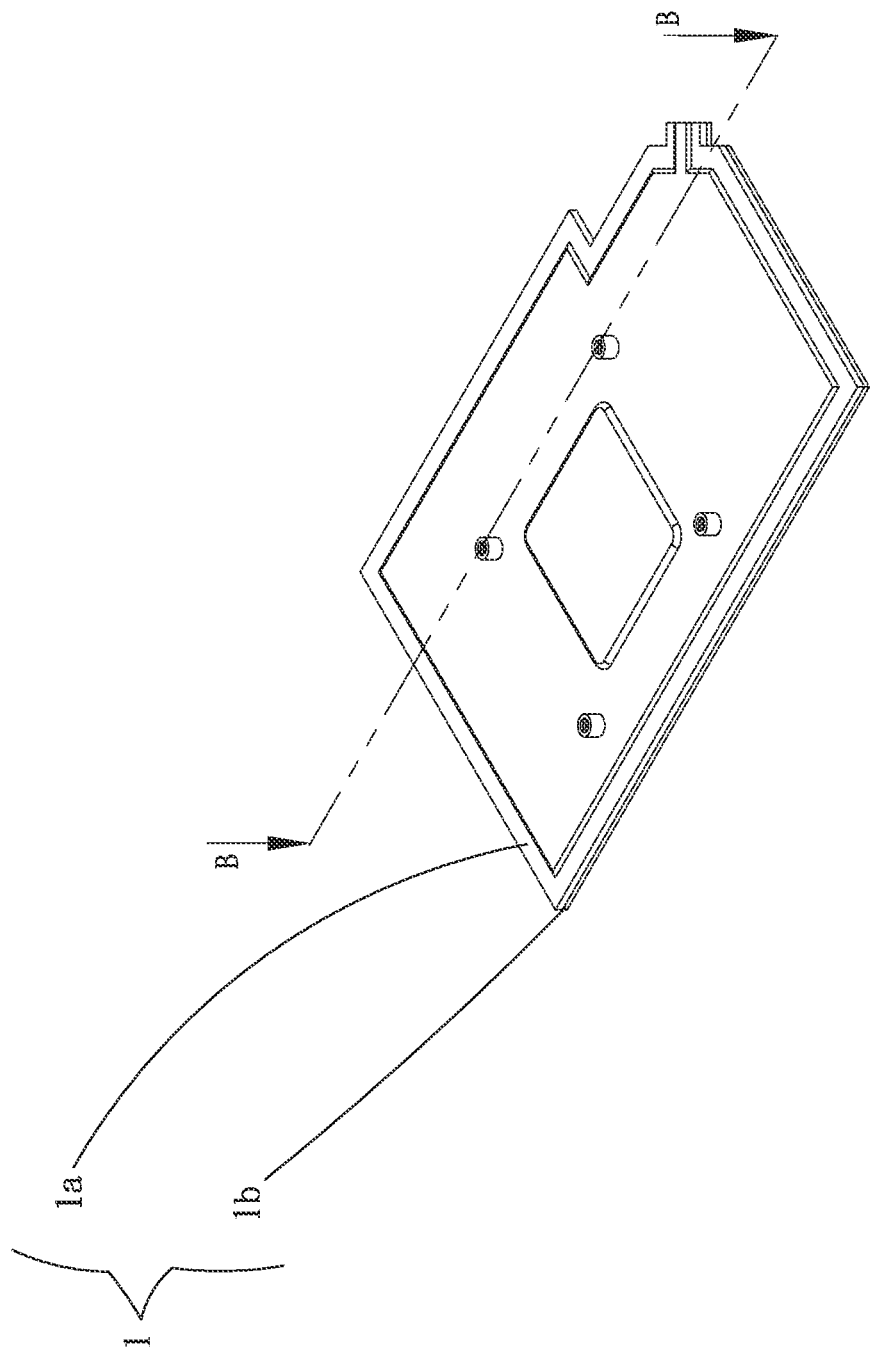
FIG. 7 is an assembled perspective view of a heat dissipation element with mounting structure according to a fourth embodiment of the present invention.
Figure 8:
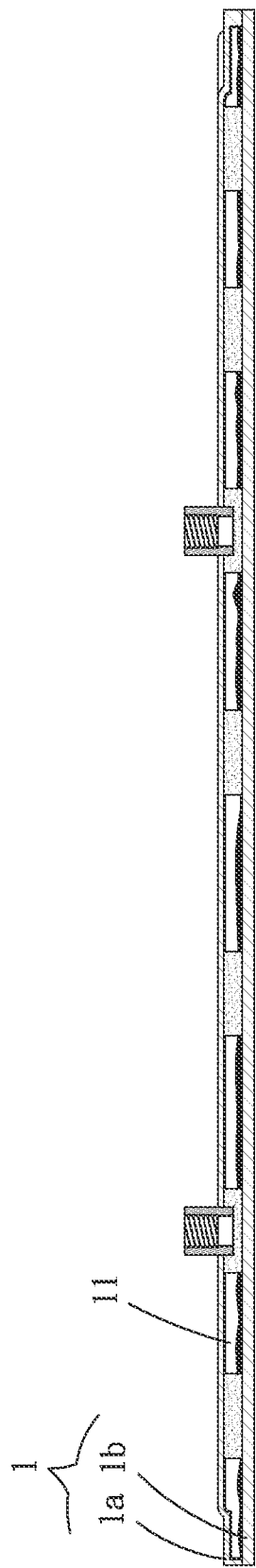
FIG. 8 is a sectional view taken along line B-B of FIG. 7.

Please refer to FIG. 7 that is an assembled perspective view of a heat dissipation element with mounting structure according to a fourth embodiment of the present invention, and to FIG. 8 that is a sectional view taken along line B-B of FIG. 7. As shown, the fourth embodiment is generally structurally similar to the first embodiment, except that the main body 1 in the fourth embodiment is formed from a first plate 1a and a second plate 1b, which are closed to each other to together define the chamber 11 therebetween.

Figure 9:
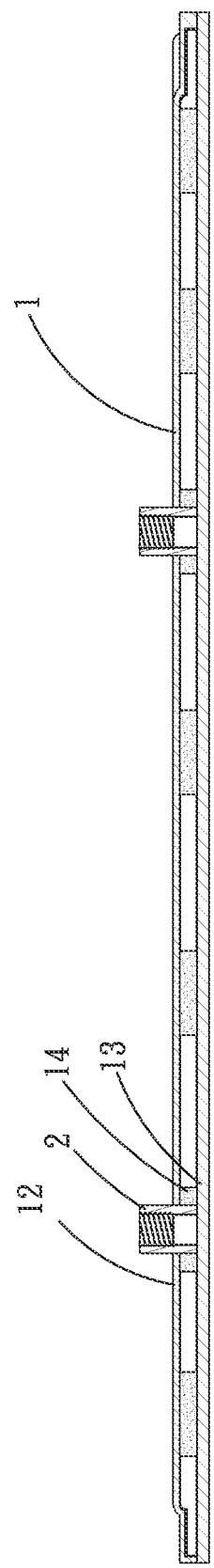
FIG. 9 is an assembled sectional view of a heat dissipation element with mounting structure according to a fifth embodiment of the present invention.

FIG. 9 is a sectional view of a heat dissipation element with mounting structure according to a fifth embodiment of the present invention. As shown, the fourth embodiment is generally structurally similar to the first embodiment, except that the mounting elements 2 in the fifth embodiment are extended through the first side 12 of the main body 1 and a full length of the supports 14 without extending into the second side 13 of the main body 1.

The present invention has been described with some preferred embodiments thereof and it is understood that many changes and modifications in the described embodiments can be carried out without departing from the scope and the spirit of the invention that is intended to be limited only by the appended claims.

What is claimed is:

1. A heat dissipation element with mounting structure, comprising:
   a main body including a first side and a second side, between which a sealed chamber is defined; a plurality of discreet support elements located in the chamber and respectively connected at two opposite ends to the first side and the second side of the main body; a working fluid filled in the chamber; and at least one wick structure layer internally attached to the chamber; and a plurality of mounting elements respectively defining an axial bore and having an end extended through the first side of the main body into the support elements to thereby connect to the main body in a manner that does not fluidly communicate with the sealed chamber.

2. The heat dissipation element with mounting structure as claimed in claim 1, wherein the bores defined in the mounting elements are internally provided with screw threads.

3. The heat dissipation element with mounting structure as claimed in claim 1, wherein the wick structure layer is internally attached to the chamber with structural integrity.

4. The heat dissipation element with mounting structure as claimed in claim 1, wherein the main body is correspondingly attached to a circuit board, and is provided on an outer surface with at least one raised heat absorption zone for contacting with at least one heat source on the circuit board; the circuit board being provided at locations around the heat source with a plurality of holes corresponding to the mounting elements; and the main body being connected at another outer surface opposite to the heat absorption zone to a heat sink.

5. The heat dissipation element with mounting structure as claimed in claim 4, wherein the main body and the circuit board are locked to each other by fastening elements extended through the holes formed on the circuit board into the bores of the mounting elements connected to the main body.

6. The heat dissipation element with mounting structure as claimed in claim 1, wherein the main body is provided on an outer surface with at least one raised heat absorption zone, and the raised heat absorption zone being located in the vicinity of the mounting elements.

7. The heat dissipation element with mounting structure as claimed in claim 1, wherein the main body is formed from a first plate and a second plate that are correspondingly closed to each other to define the chamber therebetween.

8. The heat dissipation element with mounting structure as claimed in claim 1, wherein the mounting elements are extended through the first side of the main body and a full length of the supports without extending into the second side of the main body.

9. The heat dissipation element with mounting structure as claimed in claim 1, wherein the mounting elements are extended through the first side of the main body into the supports by way of a mechanical process, and the mechanical process being selected from the group consisting of stamping, boring, and drilling.

* * * * *